(12) United States Patent
Chang et al.

(10) Patent No.: US 12,110,436 B2
(45) Date of Patent: Oct. 8, 2024

(54) CO/CU SELECTIVE WET ETCHANT

(71) Applicant: Versum Materials US, LLC, Tempe, AZ (US)

(72) Inventors: Chung-Yi Chang, New Taipei (TW); Wen Dar Liu, Chupei (TW); Yi-Chia Lee, Chupei (TW)

(73) Assignee: Versum Materials US, LLC, Tempe, AZ (US)

(*) Notice: Subject to any disclaimer, the term of this patent is extended or adjusted under 35 U.S.C. 154(b) by 99 days.

(21) Appl. No.: 17/756,223

(22) PCT Filed: Sep. 30, 2020

(86) PCT No.: PCT/US2020/053434
§ 371 (c)(1),
(2) Date: May 19, 2022

(87) PCT Pub. No.: WO2021/126340
PCT Pub. Date: Jun. 24, 2021

(65) Prior Publication Data
US 2023/0002675 A1    Jan. 5, 2023

Related U.S. Application Data

(60) Provisional application No. 63/062,733, filed on Aug. 7, 2020, provisional application No. 62/951,067, filed on Dec. 20, 2019.

(51) Int. Cl.
*C09K 13/08* (2006.01)
*C09K 13/06* (2006.01)
*H01L 21/3213* (2006.01)

(52) U.S. Cl.
CPC .............. *C09K 13/08* (2013.01); *C09K 13/06* (2013.01); *H01L 21/32134* (2013.01)

(58) Field of Classification Search
None
See application file for complete search history.

(56) References Cited

U.S. PATENT DOCUMENTS 10,876,082 B2 * 12/2020 Yarita ............... H01L 21/02074
2003/0078173 A1 * 4/2003 Wojtczak .......... H01L 21/32136
510/499
(Continued)

FOREIGN PATENT DOCUMENTS

CN    107227462 A    10/2017
CN    107527808      12/2017
(Continued)

OTHER PUBLICATIONS

The China National Intellectual Property Administration; Patent Search Report; Application No. 2020800883126.
(Continued)

*Primary Examiner* — Allan W. Olsen
(74) *Attorney, Agent, or Firm* — William T. Slaven, IV

(57) ABSTRACT

The disclosed and claimed subject matter relates to wet etchants exhibiting high copper and cobalt etching rates where the etching rate ratio between the two metals can be varied. The wet etchants have a composition comprising a formulation consisting of: at least one alkanolamine having at least two carbon atoms, at least one amino substituent and at least one hydroxyl substituent with the amino and hydroxyl substituents attached to two different carbon atoms; at least one pH adjuster for adjusting the pH of the formulation to between approximately 9 and approximately 12; at least one chelating agent; and water.

21 Claims, 7 Drawing Sheets

(56) References Cited

U.S. PATENT DOCUMENTS

| | | | |
|---|---|---|---|
| 2003/0199566 A1* | 10/2003 | Bok | C07C 235/34 |
| | | | 548/338.1 |
| 2008/0076688 A1* | 3/2008 | Barnes | C11D 3/30 |
| | | | 134/42 |
| 2009/0065735 A1* | 3/2009 | Kolics | C11D 7/34 |
| | | | 252/79.1 |
| 2010/0015805 A1* | 1/2010 | Mayer | H01L 21/288 |
| | | | 438/692 |
| 2010/0029088 A1* | 2/2010 | Mayer | C25F 3/12 |
| | | | 438/748 |
| 2011/0297873 A1* | 12/2011 | Kuroiwa | C23F 1/44 |
| | | | 252/79.3 |
| 2012/0009788 A1* | 1/2012 | Liu | C11D 7/08 |
| | | | 134/28 |
| 2013/0143785 A1* | 6/2013 | Taniguchi | C11D 3/361 |
| | | | 510/175 |
| 2014/0100151 A1* | 4/2014 | Egbe | C11D 7/06 |
| | | | 510/176 |
| 2014/0186996 A1* | 7/2014 | Takeuchi | H01L 21/465 |
| | | | 252/79.4 |
| 2015/0191830 A1 | 7/2015 | Susaki et al. | |
| 2015/0267112 A1* | 9/2015 | Dory | H01L 21/32134 |
| | | | 252/79.1 |
| 2017/0009353 A1* | 1/2017 | Hwang | H01L 21/30625 |
| 2017/0145311 A1* | 5/2017 | Liu | H01L 21/30608 |
| 2017/0183537 A1* | 6/2017 | Yoon | H01L 21/28079 |
| 2018/0105774 A1* | 4/2018 | Inaoka | G03F 7/425 |
| 2019/0085240 A1 | 3/2019 | Liu et al. | |
| 2019/0103282 A1 | 4/2019 | Ge et al. | |
| 2020/0255770 A1* | 8/2020 | Das | C11D 3/3947 |
| 2020/0339523 A1* | 10/2020 | Hoogboom | C07D 265/30 |
| 2021/0356654 A1* | 11/2021 | McQuaide | G02B 26/103 |
| 2022/0049160 A1* | 2/2022 | Hong | C09K 13/08 |

FOREIGN PATENT DOCUMENTS

| | | |
|---|---|---|
| CN | 209423288 A | 3/2019 |
| EP | 2282867 A1 | 9/2011 |
| EP | 3480288 A1 | 8/2019 |
| JP | 6285983 B2 | 2/2018 |
| WO | 2016187199 A1 | 11/2016 |
| WO | 2019110680 A2 | 6/2019 |
| WO | 2020257103 A1 | 12/2020 |
| WO | 2021011515 A1 | 1/2021 |
| WO | 2021061922 A1 | 4/2021 |

OTHER PUBLICATIONS

Shih, C-W., et al., "Anisotropic copper etching with monoethanolamine-complexed cupric ion solutions," Journal of Applied Electrochemistry 33: 403-10; (2003).

International Search Report; PCT/US2020/053434; Jan. 14, 2021.

European Patent Office; Supplementary European Search Report; Application No. EP 20904187; The Hague; Dec. 5, 2023.

Notice of Reasons for Rejection; JP Patent Application No. 2022-537472; Apr. 3, 2024.

* cited by examiner

| Item | Reference | NH4OH solution | Ex. 13 | Ex. 16 |
|---|---|---|---|---|
| AFM | | Pitting corrosion | | |
| Rq | 1.21 | 9.62 | 3.11 | 1.95 |
| Ra | 0.95 | 7.92 | 2.82 | 1.64 |

FIG. 7

CO/CU SELECTIVE WET ETCHANT

This application is a national stage application, filed under 35 U.S.C. § 371, of International Patent Application No. PCT/US2020/053434 (filed on 30 Sep. 2020) which claims the benefit of U.S. Provisional Patent Application No. 62/951,067 (filed on 20 Dec. 2019) and U.S. Provisional Patent Application No. 63/062,733 (filed on 7 Aug. 2020) each of which applications is incorporated herein by reference in their entirety.

BACKGROUND

Field

The disclosed and claimed subject relates to wet etchants. In particular, the disclosed and claimed subject matter relates to wet etchants exhibiting high copper and cobalt etching rates where the etching rate ratio between the two metals can be varied.

Related Art

Co/Cu composite interconnect systems are widely applicated in BEOL for advanced IC device owing to their good EM and TDDB (time dependent dielectric breakdown) reliability. For the next advance technology device, Cu and Co recesses become more important for fully self-aligned via design. However, conventional high rate copper wet etchants cannot simultaneously achieve high cobalt etching rates due to (i) the difference of chemical properties of copper and cobalt and (ii) the galvanic corrosion effect between the two metals.

For example, it has been described (see *Journal of Applied Electrochemistry*, 33: 403-10 (2003)) that a monoethanolamine based formulation including cupric chloride dihydrate can give a high copper etching rate. Although conventional wet etchants of copper provide high etch rates at high pH values, the cobalt etching rate is very low at high pH due to the formation of an inert $Co(OH)_2$ layer on the cobalt surface.

SUMMARY

This summary section does not specify every embodiment and/or incrementally novel aspect of the disclosed and claimed subject matter. Instead, this summary only provides a preliminary discussion of different embodiments and corresponding points of novelty over conventional techniques and the known art. For additional details and/or possible perspectives of the disclosed and claimed subject matter and embodiments, the reader is directed to the Detailed Description section and corresponding figures of the disclosure as further discussed below.

The order of discussion of the different steps described herein has been presented for clarity sake. In general, the steps disclosed herein can be performed in any suitable order. Additionally, although each of the different features, techniques, configurations, etc. disclosed herein may be discussed in different places of this disclosure, it is intended that each of the concepts can be executed independently of each other or in combination with each other as appropriate. Accordingly, the disclosed and claimed subject matter can be embodied and viewed in many different ways.

The disclosed and claimed subject matter is directed to novel chemical formulations which can remove both copper and cobalt at high etching rates (>50 Å/minute when copper and cobalt are coupled) which also overcame the chemical properties differences and galvanic corrosion effects between the two metals. In a further aspect, the novel formulations exhibit superior etching selectivity of Cu and Co in the range of about 1 to 1.

The disclosed and claimed chemical formulations include:
(i) at least one alkanolamine having at least two carbon atoms, at least one amino substituent and at least one hydroxyl substituent, where the amino and hydroxyl substituents are attached to two different carbon atoms, preferably of formula (I):

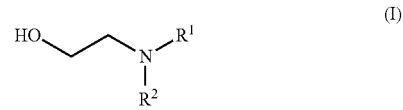

(I)

wherein each of $R^1$ and $R^2$ is independently selected from H, an unsubstituted $C_1$-$C_6$ alkyl, a substituted $C_1$-$C_6$ alkyl, a branched $C_3$-$C_6$ alkyl and a $C_1$-$C_6$ alkylamino;
(ii) at least one pH adjuster for adjusting the pH of the formulation to between approximately 9 and approximately 12;
(iii) at least one chelating agent; and
(iv) water.

In a further aspect of this embodiment, the disclosed and claimed chemical formulations consist essentially of (i), (ii), (iii) and (iv). In yet a further aspect of this embodiment, the disclosed and claimed chemical formulations consist of (i), (ii), (iii) and (iv).

In another embodiment, the disclosed and claimed chemical formulations include (i), (ii), (iii), (iv) described above and further include (v) at least one water miscible solvent. In a further aspect of this embodiment, the disclosed and claimed chemical formulations consist essentially of (i), (ii), (iii), (iv) and (v). In yet a further aspect of this embodiment, the disclosed and claimed chemical formulations consist of (i), (ii), (iii), (iv) and (v).

In another embodiment, the disclosed and claimed chemical formulations include (i), (ii), (iii), and (iv) described above and further include (vi) at least one wettability adjusting material (e.g., a surfactant) to improve roughness performance. In a further aspect of this embodiment, the disclosed and claimed chemical formulations consist essentially of (i), (ii), (iii), (iv) and (vi). In yet a further aspect of this embodiment, the disclosed and claimed chemical formulations consist of (i), (ii), (iii), (iv) and (vi).

In another embodiment, the disclosed and claimed chemical formulations include (i), (ii), (iii), (iv), (v) and (vi). In a further aspect of this embodiment, the disclosed and claimed chemical formulations consist essentially of (i), (ii), (iii), (iv), (v) and (vi). In yet a further aspect of this embodiment, the disclosed and claimed chemical formulations consist of (i), (ii), (iii), (iv), (v) and (vi).

In a further aspect, the at least one water miscible solvent (v) includes at least two water miscible solvents.

In one embodiment, the formulation includes the alkanolamine of formula (I) where one or both of $R^1$ and $R^2$ is H.

In one embodiment, the formulation includes the alkanolamine of formula (I) where both $R^1$ and $R^2$ is H:

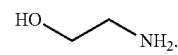

In one embodiment, the formulation includes the alkanolamine of formula (I) where one of $R^1$ and $R^2$ is H and the other of $R^1$ and $R^2$ is a —$CH_3$ group:

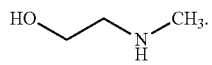

In one embodiment, the formulation includes the alkanolamine of formula (I) where one of $R^1$ and $R^2$ is H and the other of $R^1$ and $R^2$ is a substituted $C_1$-$C_6$ alkyl of the formula —$CH_2CH_2OH$:

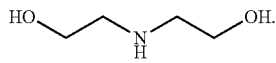

In one embodiment, the formulation includes the alkanolamine of formula (I) where both $R^1$ and $R^2$ is a substituted $C_1$-$C_6$ alkyl of the formula —$CH_2CH_2OH$:

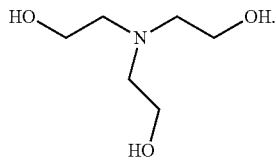

In one embodiment, the formulation includes the alkanolamine of formula (I) where one of $R^1$ and $R^2$ is H and the other of $R^1$ and $R^2$ is a substituted $C_1$-$C_6$ alkyl of the formula —$CH_2CH_2NH_2$:

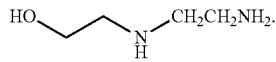

The disclosed and claimed subject matter is further directed to the use and synthesis of the disclosed and claimed chemical formulations.

The disclosed and claimed subject matter is further directed to a method for testing the Cu and Co etching rate of an etching formulation (described herein as a "coupled") which simulates the galvanic corrosion effect of a device wafer. A coupled test is illustrated in FIG. 1.

BRIEF DESCRIPTION OF THE DRAWINGS

The accompanying drawings, which are included to provide a further understanding of the disclosed subject matter and are incorporated in and constitute a part of this specification, illustrate embodiments of the disclosed subject matter and together with the description serve to explain the principles of the disclosed subject matter. In the drawings:

FIG. 7 illustrates the AFM surface roughness analysis for Ex. 13 and Ex. 16 on copper.

DEFINITIONS

Figure 1:
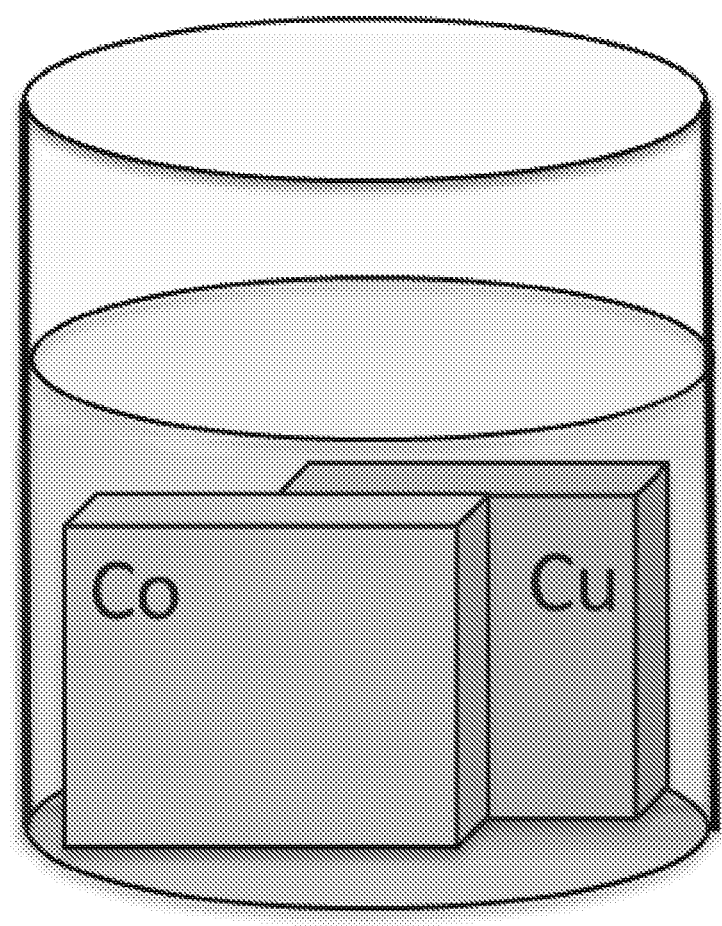
FIG. 1 illustrates a coupled beaker test for testing the Cu and Co etching rate.

Unless otherwise stated, the following terms used in the specification and claims shall have the following meanings for this application.

In this application, the use of the singular includes the plural, and the words "a," "an" and "the" mean "at least one" unless specifically stated otherwise. Furthermore, the use of the term "including," as well as other forms such as "includes" and "included," is not limiting. Also, terms such as "element" or "component" encompass both elements or components including one unit and elements or components that include more than one unit, unless specifically stated otherwise. As used herein, the conjunction "and" is intended to be inclusive and the conjunction "or" is not intended to be exclusive, unless otherwise indicated. For example, the phrase "or, alternatively" is intended to be exclusive. As used herein, the term "and/or" refers to any combination of the foregoing elements including using a single element.

The term "about" or "approximately," when used in connection with a measurable numerical variable, refers to the indicated value of the variable and to all values of the variable that are within the experimental error of the indicated value (e.g., within the 95% confidence limit for the mean) or within percentage of the indicated value (e.g., ±10%, ±5%), whichever is greater.

As used herein, "$C_{x-y}$" designates the number of carbon atoms in a chain. For example, $C_{1-6}$ alkyl refers to an alkyl chain having a chain of between 1 and 6 carbons (e.g., methyl, ethyl, propyl, butyl, pentyl and hexyl). Unless specifically stated otherwise, the chain can be linear or branched.

Unless otherwise indicated, "alkyl" refers to hydrocarbon groups which can be linear, branched (e.g., methyl, ethyl, propyl, isopropyl, tert-butyl and the like), cyclic (e.g., cyclohexyl, cyclopropyl, cyclopentyl and the like) or multicyclic (e.g., norbornyl, adamantly and the like). Suitable acyclic groups can be methyl, ethyl, n- or iso-propyl, n-,iso, or tert-butyl, linear or branched pentyl, hexyl, heptyl, octyl, decyl, dodecyl, tetradecyl and hexadecyl. Unless otherwise stated, alkyl refers to 1-10 carbon atom moieties. These alkyl moieties may be substituted or unsubstituted.

"Halogenated alkyl" refers to a linear, cyclic or branched saturated alkyl group as defined above in which one or more of the hydrogens has been replaced by a halogen (e.g., F, Cl, Br and I). Thus, for example, a fluorinated alkyl (a.k.a. "fluoroalkyl") refers to a linear, cyclic or branched saturated alkyl group as defined above in which one or more of the hydrogens has been replaced by fluorine (e.g., trifluoromethyl, pefluoroethyl, 2,2,2-trifluoroethyl, prefluoroisopropyl, perfluorocyclohexyl and the like). Such haloalkyl moieties (e.g., fluoroalkyl moieties), if not perhalogenated/multihalogenated, may be unsubstituted or further substituted.

"Alkoxy" (a.k.a. "alkyloxy") refers to an alkyl group as defined above which is attached through an oxy (—O—) moiety (e.g., methoxy, ethoxy, propoxy, butoxy, 1,2-isopropoxy, cyclopentyloxy, cyclohexyloxy and the like). These alkoxy moieties may be substituted or unsubstituted.

"Alkyl carbonyl" refers to an alkyl group as defined above which is attached through a carbonyl group (—C(=O)—) moiety (e.g., methylcarbonyl, ethylcarbonyl, propylcarbonyl, buttylcarbonyl, cyclopentylcarbonyl and the like). These alkyl carbonyl moieties may be substituted or unsubstituted.

"Halo" or "halide" refers to a halogen (e.g., F, Cl, Br and I).

"Hydroxy" (a.k.a. "hydroxyl") refers to an —OH group.

Unless otherwise indicated, the term "substituted" when referring to an alkyl, alkoxy, fluorinated alkyl and the like refers to one of these moieties which also contains one or more substituents including, but not limited, to the following substituents: alkyl, substituted alkyl, unsubstituted aryl, substituted aryl, alkyloxy, alkylaryl, haloalkyl, halide, hydroxy, amino and amino alkyl. Similarly, the term "unsubstituted" refers to these same moieties where no substituents apart from hydrogen are present.

As used herein, and unless otherwise specified, the term "aromatic" refers to unsaturated cyclic hydrocarbons having a delocalized conjugated π system and having from 4 to 20 carbon atoms (aromatic $C_4$-$C_{20}$ hydrocarbon). Exemplary aromatics include, but are not limited to benzene, toluene, xylenes, mesitylene, ethylbenzenes, cumene, naphthalene, methylnaphthalene, dimethylnaphthalenes, ethylnaphthalenes, acenaphthalene, anthracene, phenanthrene, tetraphene, naphthacene, benzanthracenes, fluoranthrene, pyrene, chrysene, triphenylene, and the like, and combinations thereof. The aromatic may optionally be substituted, e.g., with one or more alkyl group, alkoxy group, halogen, etc. For example, the aromatic may include anisole. Additionally, the aromatic may comprise one or more heteroatoms. Examples of heteroatoms include, but are not limited to, nitrogen, oxygen, phosphorus, boron, and/or sulfur. Aromatics with one or more heteroatom include, but are not limited to furan, benzofuran, thiophene, benzothiophene, oxazole, thiazole and the like, and combinations thereof. The aromatic may comprise monocyclic, bicyclic, tricyclic, and/or polycyclic rings (in some embodiments, at least monocyclic rings, only monocyclic and bicyclic rings, or only monocyclic rings) and may be fused rings.

The term "non-aromatic" means four or more carbon atoms joined in at least one ring structure wherein at least one of the four or more carbon atoms in the ring structure is not an aromatic carbon atom.

When referring to compositions of the inventive wet etchant described herein in terms of weight %, it is understood that in no event shall the weight % of all components, including non-essential components, such as impurities, add to more than 100 weight %. In compositions "consisting essentially of" recited components, such components may add up to 100 weight % of the composition or may add up to less than 100 weight %. Where the components add up to less than 100 weight %, such composition may include some small amounts of non-essential contaminants or impurities. For example, in one such embodiment, the formulation can contain 2% by weight or less of impurities. In another embodiment, the formulation can contain 1% by weight or less of impurities. In a further embodiment, the formulation can contain 0.05% by weight or less of impurities. In other such embodiments, the constituents can form at least 90 wt %, more preferably at least 95 wt %, more preferably at least 99 wt %, more preferably at least 99.5 wt %, most preferably at least 99.9 wt %, and can include other ingredients that do not material affect the performance of the wet etchant. Otherwise, if no significant non-essential impurity component is present, it is understood that the composition of all essential constituent components will essentially add up to 100 weight %.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that any of the incorporated literature and similar materials defines a term in a manner that contradicts the definition of that term in this application, this application controls.

DETAILED DESCRIPTION

It is to be understood that both the foregoing general description and the following detailed description are illustrative and explanatory, and are not restrictive of the subject matter, as claimed. The objects, features, advantages and ideas of the disclosed subject matter will be apparent to those skilled in the art from the description provided in the specification, and the disclosed subject matter will be readily practicable by those skilled in the art on the basis of the description appearing herein. The description of any "preferred embodiments" and/or the examples which show preferred modes for practicing the disclosed subject matter are included for the purpose of explanation and are not intended to limit the scope of the claims.

It will also be apparent to those skilled in the art that various modifications may be made in how the disclosed subject matter is practiced based on described aspects in the specification without departing from the spirit and scope of the disclosed subject matter disclosed herein.

As set forth above, the disclosed subject matter relates to chemical formulations which can remove both copper and cobalt at high etching rate (>50 Å/minute when copper and cobalt are coupled) which also overcame the chemical properties differences and galvanic corrosion effects between the two metals and having etching selectivity of Cu and Co in the range of about 1 to 1.2 Thus, the formulations have a copper etching rate of greater that approximately 50 Å/minute and a cobalt etching rate of greater that approximately 50 Å/minute when copper and cobalt are coupled. In another embodiment, the formulations have a copper etching rate of greater that approximately 30 Å/minute and a cobalt etching rate of greater that approximately 30 Å/minute when copper and cobalt are coupled In one embodiment the disclosed and claimed chemical formulations include:
 (i) at least one alkanolamine having at least two carbon atoms, at least one amino substituent and at least one hydroxyl substituent, the amino and hydroxyl substituents attached to two different carbon atoms;
 (ii) at least one pH adjuster for adjusting the pH of the formulation to between approximately 9 and approximately 12;
 (iii) at least one chelating agent; and
 (iv) water.

In one aspect of this embodiment, the at least one alkanolamine having at least two carbon atoms, at least one amino substituent and at least one hydroxyl substituent with the amino and hydroxyl substituents attached to two different carbon atoms, is of formula (I):

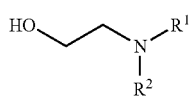

(I)

wherein each of R¹ and R² is independently selected from H, an unsubstituted $C_1$-$C_6$ alkyl, a substituted $C_1$-$C_6$ alkyl, a branched $C_3$-$C_6$ alkyl and a $C_1$-$C_6$ alkylamino.

In a further aspect of the above embodiment, the formulation consists essentially of (i) the at least one alkanolamine having at least two carbon atoms, at least one amino substituent and at least one hydroxyl substituent with the amino and hydroxyl substituents attached to two different carbon atoms, (ii) the at least one pH adjuster for adjusting the pH of the formulation to between approximately 9 and approximately 12; (iii) the at least one chelating agent and (iv) water. In such an embodiment, the combined amounts of (i), (ii), (iii) and (iv) do not necessarily equal 100% by weight, and can include other ingredients (e.g., additional solvent(s), including water, common additives and/or impurities) that do not materially change the effectiveness of the formulation. In one aspect of this embodiment, the at least one alkanolamine having at least two carbon atoms, at least one amino substituent and at least one hydroxyl substituent with the amino and hydroxyl substituents attached to two different carbon atoms, is of formula (I):

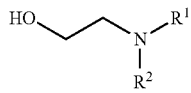

(I)

wherein each of R¹ and R² is independently selected from H, an unsubstituted $C_1$-$C_6$ alkyl, a substituted $C_1$-$C_6$ alkyl, a branched $C_3$-$C_6$ alkyl and a $C_1$-$C_6$ alkylamino.

In a further aspect of this embodiment, the formulation consists of (i) the at least one alkanolamine having at least two carbon atoms, at least one amino substituent and at least one hydroxyl substituent with the amino and hydroxyl substituents attached to two different carbon atoms, (ii) the at least one pH adjuster for adjusting the pH of the formulation to between approximately 9 and approximately 12; (iii) the at least one chelating agent; and (iv) water. In such an embodiment, the combined amounts of (i), (ii), (iii) and (iv) equal approximately 100% by weight but may include other small and/or trace amounts of impurities that are present in such small quantities that they do not materially change the effectiveness of the formulation. For example, in one such embodiment, the formulation can contain 2% by weight or less of impurities. In another embodiment, the formulation can contain 1% by weight or less than of impurities. In a further embodiment, the formulation can contain 0.05% by weight or less than of impurities. In one aspect of this embodiment, the at least one alkanolamine having at least two carbon atoms, at least one amino substituent and at least one hydroxyl substituent with the amino and hydroxyl substituents attached to two different carbon atoms, is of formula (I):

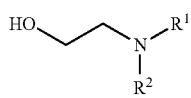

(I)

wherein each of R¹ and R² is independently selected from H, an unsubstituted $C_1$-$C_6$ alkyl, a substituted $C_1$-$C_6$ alkyl, a branched $C_3$-$C_6$ alkyl and a $C_1$-$C_6$ alkylamino.

In another embodiment, the disclosed and claimed chemical formulations include:
(i) at least one alkanolamine having at least two carbon atoms, at least one amino substituent and at least one hydroxyl substituent, the amino and hydroxyl substituents attached to two different carbon atoms;
(ii) at least one pH adjuster for adjusting the pH of the formulation to between approximately 9 and approximately 12;
(iii) at least one chelating agent;
(iv) water; and
(v) at least one water miscible solvent.

In one aspect of this embodiment, the at least one alkanolamine having at least two carbon atoms, at least one amino substituent and at least one hydroxyl substituent with the amino and hydroxyl substituents attached to two different carbon atoms, is of formula (I):

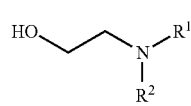

(I)

wherein each of R¹ and R² is independently selected from H, an unsubstituted $C_1$-$C_6$ alkyl, a substituted $C_1$-$C_6$ alkyl, a branched $C_3$-$C_6$ alkyl and a $C_1$-$C_6$ alkylamino.

In a further aspect of this embodiment, the formulation consists essentially of (i) the at least one alkanolamine having at least two carbon atoms, at least one amino substituent and at least one hydroxyl substituent with the amino and hydroxyl substituents attached to two different carbon atoms, (ii) the at least one pH adjuster for adjusting the pH of the formulation to between approximately 9 and approximately 12; (iii) the at least one chelating agent; (iv) water; and (v) the at least one water miscible solvent in varying concentrations. In such an embodiment, the combined amounts of (i), (ii), (iii), (iv) and (v) do not necessarily equal 100% by weight, and can include other ingredients (e.g., additional solvent(s), including water, common additives and/or impurities) that do not materially change the effectiveness of the formulation. In one aspect of this embodiment, the at least one alkanolamine having at least two carbon atoms, at least one amino substituent and at least one hydroxyl substituent with the amino and hydroxyl substituents attached to two different carbon atoms, is of formula (I):

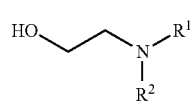

(I)

wherein each of R and R² is independently selected from H, an unsubstituted $C_1$-$C_6$ alkyl, a substituted $C_1$-$C_6$ alkyl, a branched $C_3$-$C_6$ alkyl and a $C_1$-$C_6$ alkylamino.

In a further embodiment, the formulation consists of (i) the at least one alkanolamine having at least two carbon atoms, at least one amino substituent and at least one hydroxyl substituent with the amino and hydroxyl substituents attached to two different carbon atoms, (ii) the at least one pH adjuster for adjusting the pH of the formulation to between approximately 9 and approximately 12; (iii) the at least one chelating agent; (iv) water; and (v) the at least one water miscible solvent in varying concentrations. In such an embodiment, the combined amounts of (i), (ii), (iii), (iv) and (v) equal approximately 100% by weight but may include other small and/or trace amounts of impurities that are present in such small quantities that they do not materially change the effectiveness of the formulation. For example, in one such embodiment, the formulation can contain 2% by weight or less of impurities. In another embodiment, the formulation can contain 1% by weight or less than of impurities. In a further embodiment, the formulation can contain 0.05% by weight or less than of impurities. In one aspect of this embodiment, the at least one alkanolamine having at least two carbon atoms, at least one amino substituent and at least one hydroxyl substituent with the amino and hydroxyl substituents attached to two different carbon atoms, is of formula (I):

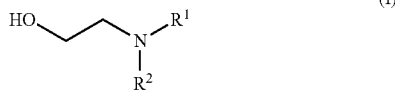

(I)

wherein each of $R^1$ and $R^2$ is independently selected from H, an unsubstituted $C_1$-$C_6$ alkyl, a substituted $C_1$-$C_6$ alkyl, a branched $C_3$-$C_6$ alkyl and a $C_1$-$C_6$ alkylamino.

In another embodiment, the disclosed and claimed chemical formulations include:
(i) at least one alkanolamine having at least two carbon atoms, at least one amino substituent and at least one hydroxyl substituent, the amino and hydroxyl substituents attached to two different carbon atoms;
(ii) at least one pH adjuster for adjusting the pH of the formulation to between approximately 9 and approximately 12;
(iii) at least one chelating agent;
(iv) water;
(v) at least one water miscible solvent; and
(vi) at least one wettability adjusting material.

In one aspect of this embodiment, the at least one alkanolamine having at least two carbon atoms, at least one amino substituent and at least one hydroxyl substituent with the amino and hydroxyl substituents attached to two different carbon atoms, is of formula (I):

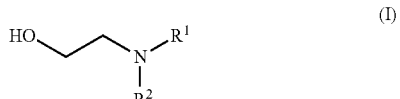

(I)

wherein each of R and $R^2$ is independently selected from H, an unsubstituted $C_1$-$C_6$ alkyl, a substituted $C_1$-$C_6$ alkyl, a branched $C_3$-$C_6$ alkyl and a $C_1$-$C_6$ alkylamino.

In a further aspect of this embodiment, the formulation consists essentially of (i) the at least one alkanolamine having at least two carbon atoms, at least one amino substituent and at least one hydroxyl substituent with the amino and hydroxyl substituents attached to two different carbon atoms, (ii) the at least one pH adjuster for adjusting the pH of the formulation to between approximately 9 and approximately 12; (iii) the at least one chelating agent; (iv) water; (v) the at least one water miscible solvent and (vi) at least one wettability adjusting material in varying concentrations. In such an embodiment, the combined amounts of (i), (ii), (iii), (iv), (v) and (vi) do not necessarily equal 100% by weight, and can include other ingredients (e.g., additional solvent(s), including water, common additives and/or impurities) that do not materially change the effectiveness of the formulation. In one aspect of this embodiment, the at least one alkanolamine having at least two carbon atoms, at least one amino substituent and at least one hydroxyl substituent with the amino and hydroxyl substituents attached to two different carbon atoms, is of formula (I):

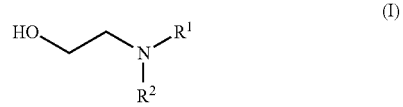

(I)

wherein each of Rand $R^2$ is independently selected from H, an unsubstituted $C_1$-$C_6$ alkyl, a substituted $C_1$-$C_6$ alkyl, a branched $C_3$-$C_6$ alkyl and a $C_1$-$C_6$ alkylamino. In another aspect of this embodiment, the at least one wettability adjusting material is a surfactant.

In a further aspect of this embodiment, the formulation consists of (i) the at least one alkanolamine having at least two carbon atoms, at least one amino substituent and at least one hydroxyl substituent with the amino and hydroxyl substituents attached to two different carbon atoms, (ii) the at least one pH adjuster for adjusting the pH of the formulation to between approximately 9 and approximately 12; (iii) the at least one chelating agent; (iv) water; (v) the at least one water miscible solvent and (vi) at least one wettability adjusting material in varying concentrations. In such an embodiment, the combined amounts of (i), (ii), (iii), (iv), (v) and (vi) equal approximately 100% by weight but may include other small and/or trace amounts of impurities that are present in such small quantities that they do not materially change the effectiveness of the formulation. For example, in one such embodiment, the formulation can contain 2% by weight or less of impurities. In another embodiment, the formulation can contain 1% by weight or less than of impurities. In a further embodiment, the formulation can contain 0.05% by weight or less than of impurities. In one aspect of this embodiment, the at least one alkanolamine having at least two carbon atoms, at least one amino substituent and at least one hydroxyl substituent with the amino and hydroxyl substituents attached to two different carbon atoms, preferably of formula (I):

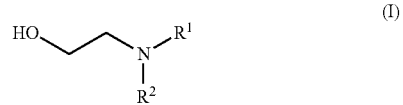

(I)

wherein each of $R^1$ and $R^2$ is independently selected from H, an unsubstituted $C_1$-$C_6$ alkyl, a substituted $C_1$-$C_6$ alkyl, a branched $C_3$-$C_6$ alkyl and a $C_1$-$C_6$ alkylamino. In another aspect of this embodiment, the at least one wettability adjusting material is a surfactant.

In another embodiment, the disclosed and claimed chemical formulations include:
(i) at least one alkanolamine having at least two carbon atoms, at least one amino substituent and at least one hydroxyl substituent, the amino and hydroxyl substituents attached to two different carbon atoms;
(ii) at least one pH adjuster for adjusting the pH of the formulation to between approximately 9 and approximately 12;
(iii) at least one chelating agent;
(iv) water; and
(vi) at least one wettability adjusting material.

In one aspect of this embodiment, the at least one alkanolamine having at least two carbon atoms, at least one amino substituent and at least one hydroxyl substituent with the amino and hydroxyl substituents attached to two different carbon atoms, is of formula (I):

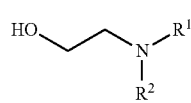

(I)

wherein each of R and R² is independently selected from H, an unsubstituted $C_1$-$C_6$ alkyl, a substituted $C_1$-$C_6$ alkyl, a branched $C_3$-$C_6$ alkyl and a $C_1$-$C_6$ alkylamino.

In a further aspect of this embodiment, the formulation consists essentially of (i) the at least one alkanolamine having at least two carbon atoms, at least one amino substituent and at least one hydroxyl substituent with the amino and hydroxyl substituents attached to two different carbon atoms, (ii) the at least one pH adjuster for adjusting the pH of the formulation to between approximately 9 and approximately 12; (iii) the at least one chelating agent; (iv) water and (vi) at least one wettability adjusting material in varying concentrations. In such an embodiment, the combined amounts of (i), (ii), (iii), (iv) and (vi) do not necessarily equal 100% by weight, and can include other ingredients (e.g., additional solvent(s), including water, common additives and/or impurities) that do not materially change the effectiveness of the formulation. In one aspect of this embodiment, the at least one alkanolamine having at least two carbon atoms, at least one amino substituent and at least one hydroxyl substituent with the amino and hydroxyl substituents attached to two different carbon atoms, is of formula (I):

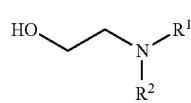

(I)

wherein each of $R^1$ and $R^2$ is independently selected from H, an unsubstituted $C_1$-$C_6$ alkyl, a substituted $C_1$-$C_6$ alkyl, a branched $C_3$-$C_6$ alkyl and a $C_1$-$C_6$ alkylamino. In another aspect of this embodiment, the at least one wettability adjusting material is a surfactant.

In a further aspect of this embodiment, the formulation consists of (i) the at least one alkanolamine having at least two carbon atoms, at least one amino substituent and at least one hydroxyl substituent with the amino and hydroxyl substituents attached to two different carbon atoms, (ii) the at least one pH adjuster for adjusting the pH of the formulation to between approximately 9 and approximately 12; (iii) the at least one chelating agent; (iv) water and (vi) at least one wettability adjusting material in varying concentrations. In such an embodiment, the combined amounts of (i), (ii), (iii), (iv) and (vi) equal approximately 100% by weight but may include other small and/or trace amounts of impurities that are present in such small quantities that they do not materially change the effectiveness of the formulation. For example, in one such embodiment, the formulation can contain 2% by weight or less of impurities. In another embodiment, the formulation can contain 1% by weight or less than of impurities. In a further embodiment, the formulation can contain 0.05% by weight or less than of impurities. In one aspect of this embodiment, the at least one alkanolamine having at least two carbon atoms, at least one amino substituent and at least one hydroxyl substituent with the amino and hydroxyl substituents attached to two different carbon atoms, preferably of formula (I):

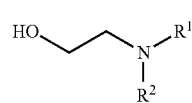

(I)

wherein each of R and $R^2$ is independently selected from H, an unsubstituted $C_1$-$C_6$ alkyl, a substituted $C_1$-$C_6$ alkyl, a branched $C_3$-$C_6$ alkyl and a $C_1$-$C_6$ alkylamino. In another aspect of this embodiment, the at least one wettability adjusting material is a surfactant.

Alkanolamine

As described above, the disclosed and claimed formulations include at least one alkanolamines having at least two carbon atoms, at least one amino substituent and at least one hydroxyl substituent, the amino and hydroxyl substituents attached to two different carbon atoms. In some embodiments, the disclosed and claimed formulations include about 1 wt % to about 10 wt % of the one or more alkanolamines. In a further aspect, the disclosed and claimed formulations include about 5 wt % of the one or more alkanolamines. In a further aspect, the disclosed and claimed formulations include about 2 wt % of the one or more alkanolamines. In a further aspect, the disclosed and claimed formulations include about 1 wt % of the one or more alkanolamines.

In some embodiments, the alkanolamine is a 1,2 alkanolamine of formula (I):

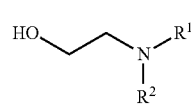

(I)

wherein each of $R^1$ and $R^2$ is independently selected from H, an unsubstituted $C_1$-$C_6$ alkyl, a substituted $C_1$-$C_6$ alkyl, a branched $C_3$-$C_6$ alkyl and a $C_1$-$C_6$ alkylamino. In some embodiments, each of $R^1$ and $R^2$ is independently selected from H, an unsubstituted $C_1$-$C_4$ alkyl, $C_1$-$C_4$ alkylamino and a $C_1$-$C_4$ alkyl substituted with an alcohol or a halogen.

In one embodiment, the formulation includes the alkanolamine of formula (I) where one or both of $R^1$ and $R^2$ is H. In a further aspect, the at least one alkanolamine of the formulation consists essentially of the alkanolamine of formula (I) where one or both of $R^1$ and $R^2$ is H. In a further aspect, the at least one alkanolamine of the formulation consists of the alkanolamine of formula (I) where one or both of $R^1$ and $R^2$ is H.

In one embodiment, the formulation includes the alkanolamine of formula (I) where both $R^1$ and $R^2$ is H:

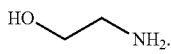

In a further aspect, the at least one alkanolamine of the formulation consists essentially of the alkanolamine of formula (I) where both $R^1$ and $R^2$ is H. In a further aspect, the at least one alkanolamine of the formulation consists of the alkanolamine of formula (I) where both $R^1$ and $R^2$ is H.

In one embodiment, the formulation includes the alkanolamine of formula (I) where one of $R^1$ and $R^2$ is H and the other of $R^1$ and $R^2$ is a —CH$_3$ group:

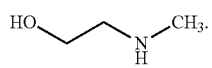

In a further aspect, the at least one alkanolamine of the formulation consists essentially of the alkanolamine of formula (I) where one of $R^1$ and $R^2$ is H and the other of $R^1$ and $R^2$ is a —CH$_3$ group. In a further aspect, the at least one alkanolamine of the formulation consists of the alkanolamine of formula (I) where one of $R^1$ and $R^2$ is H and the other of $R^1$ and $R^2$ is a —CH$_3$ group.

In one embodiment, the formulation includes the alkanolamine of formula (I) where one of $R^1$ and $R^2$ is H and the other of $R^1$ and $R^2$ is a substituted $C_1$-$C_6$ alkyl of the formula —CH$_2$CH$_2$OH:

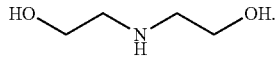

In a further aspect, the at least one alkanolamine of the formulation consists essentially of the alkanolamine of formula (I) where one of $R^1$ and $R^2$ is H and the other of $R^1$ and $R^2$ is a substituted $C_1$-$C_6$ alkyl of the formula —CH$_2$CH$_2$OH. In a further aspect, the at least one alkanolamine of the formulation consists of the alkanolamine of formula (I) where one of $R^1$ and $R^2$ is H and the other of $R^1$ and $R^2$ is a substituted $C_1$-$C_6$ alkyl of the formula —CH$_2$CH$_2$OH.

In one embodiment, the formulation includes the alkanolamine of formula (I) where both $R^1$ and $R^2$ is a substituted $C_1$-$C_6$ alkyl of the formula —CH$_2$CH$_2$OH:

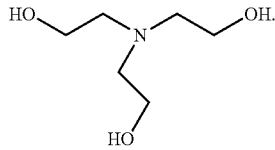

In a further aspect, the at least one alkanolamine of the formulation consists essentially of the alkanolamine of formula (I) where both $R^1$ and $R^2$ is a substituted $C_1$-$C_6$ alkyl of the formula —CH$_2$CH$_2$OH. In a further aspect, the at least one alkanolamine of the formulation consists of the alkanolamine of formula (I) where both $R^1$ and $R^2$ is a substituted $C_1$-$C_6$ alkyl of the formula —CH$_2$CH$_2$OH.

In one embodiment, the formulation includes the alkanolamine of formula (I) where one of $R^1$ and $R^2$ is H and the other of $R^1$ and $R^2$ is a substituted $C_1$-$C_6$ alkyl of the formula —CH$_2$CH$_2$NH$_2$:

In a further aspect, the at least one alkanolamine of the formulation consists essentially of the alkanolamine of formula (I) where one of $R^1$ and $R^2$ is H and the other of $R^1$ and $R^2$ is a substituted $C_1$-$C_6$ alkyl of the formula —CH$_2$CH$_2$NH$_2$. In a further aspect, the at least one alkanolamine of the formulation consists of the alkanolamine of formula (I) where one of $R^1$ and $R^2$ is H and the other of $R^1$ and $R^2$ is a substituted $C_1$-$C_6$ alkyl of the formula —CH$_2$CH$_2$NH$_2$.

In some embodiments, the at least one alkanolamine of the formulation consists essentially of a compound of formula (I):

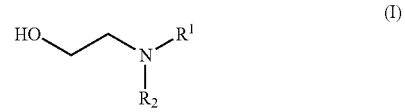

wherein each of R and $R^2$ is independently selected from H, an unsubstituted $C_1$-$C_6$ alkyl, a substituted $C_1$-$C_6$ alkyl, a branched $C_3$-$C_6$ alkyl and a $C_1$-$C_6$ alkylamino.

In some embodiments, the at least one alkanolamine of the formulation consists of a compound of formula (I):

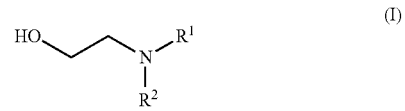

wherein each of $R^1$ and $R^2$ is independently selected from H, an unsubstituted $C_1$-$C_6$ alkyl, a substituted $C_1$-$C_6$ alkyl, a branched $C_3$-$C_6$ alkyl and a $C_1$-$C_6$ alkylamino.

Suitable alkanolamines also include, but are not limited to, ethanolamine, N-methylethanolamine, N-ethylethanolamine, N-propylethanolamine, N-butylethanolamine, diethanolamine, triethanolamine, N-methyldiethanolamine, N-ethyldiethanolamine, isopropanolamine, diisopropanolamine, triisopropanolamine, N-methylisopropanolamine, N-ethylisopropanolamine, N-propylisopropanolamine, 2-aminopropane-1-ol, N-methyl-2-aminopropane-1-ol, N-ethyl-2-aminopropane-1-ol, 1-aminopropane-3-ol, N-methyl-1-aminopropane-3-ol, N-ethyl-1-aminopropane-3-ol, 1-aminobutane-2-ol, N-methyl-1-aminobutane-2-ol, N-ethyl-1-aminobutane-2-ol, 2-aminobutane-1-ol, N-methyl-2-aminobutane-1-ol, N-ethyl-2-aminobutane-1-ol, 3-aminobutane-1-ol, N-methyl-3-aminobutane-1-ol, N-ethyl-3-aminobutane-1-ol, 1-aminobutane-4-ol, N-methyl-1-aminobutane-4-ol, N-ethyl-1-aminobutane-4-ol, 1-amino-2-methylpropane-2-ol, 2-amino-2-methylpropane-1-ol, 1-aminopentane-4-ol, 2-amino-4-methylpentane-1-ol, 2-aminohexane-1-ol, 3-aminoheptane-4-ol, 1-aminooctane-2-ol, 5-aminooctane-4-ol, 1-aminopropane-2,3-diol, 2-aminopropane-1,3-diol, tris(oxymethyl)aminomethane, 1,2-diaminopropane-3-ol, 1,3-diaminopropane-2-ol, and 2-(2-aminoethoxy)ethanol.

pH Adjuster

The pH adjuster can be any material suitable to adjust the pH of the formulations to between approximately 9 and approximately 12. Such materials include inorganic and organic acids including, but not limited to, citric acid, sulfuric acid, phosphoric acid, oxalic acid, malonic acid, lactic acid, adipic acid, acetic acid, trifluoroacetic acid, methanesulfonic acid, toluenesulfonic acid, halogen acids of the formula H—X where X=F, Cl, Br, or I. Preferred pH adjusters are hydrofluoric acid (HF) and methanesulfonic acid.

In one embodiment, the pH adjuster includes neat hydrofluoric acid (HF). In another embodiment the at least one pH adjuster consists essentially of hydrofluoric acid (HF). In another embodiment the at least one pH adjuster consists of hydrofluoric acid (HF).

In one embodiment, the pH adjuster includes methanesulfonic acid. In another embodiment the at least one pH adjuster consists essentially of methanesulfonic acid. In another embodiment the at least one pH adjuster consists of methanesulfonic acid.

The formulations will generally include from about 0.001 wt. % to about 10 wt. % of the pH adjuster. In other embodiments, the formulations will include from about 0.01 wt. % to about 7.5 wt. % of the pH adjuster. In other embodiments, the formulations will include from about 0.1 wt. % to about 5.0 wt. % of the pH adjuster. In other embodiments, the formulations will include from about 0.1 wt. % to about 1.0 wt. % of the pH adjuster.

In some embodiments, the formulations will include about 0.1 wt. % to about 1.0 wt. % of neat hydrofluoric acid (HF). In one aspect, the formulations will include about 0.125 wt. % of neat hydrofluoric acid (HF). In another aspect, the formulations will include about 0.25 wt. % of neat hydrofluoric acid (HF). In another aspect, the formulations will include about 0.5 wt. % of neat hydrofluoric acid (HF). In another aspect, the formulations will include about 0.75 wt. % of neat hydrofluoric acid (HF). In another aspect, the formulations will include about 1.0 wt. % of neat hydrofluoric acid (HF).

In some embodiments, the formulations will include about 0.1 wt. % to about 5.0 wt. % of methanesulfonic acid. In some embodiments, the formulations will include about 0.1 wt. % to about 2.0 wt. % of methanesulfonic acid. In some embodiments, the formulations will include about 1.0 wt. % to about 1.5 wt. % of methanesulfonic acid. In some embodiments, the formulations will include about 0.5 wt. % of methanesulfonic acid. In some embodiments, the formulations will include about 1.0 wt. % of methanesulfonic acid. In some embodiments, the formulations will include about 1.2 wt. % of methanesulfonic acid. In some embodiments, the formulations will include about 1.5 wt. % of methanesulfonic acid.

Chelating Agent

As described above, the disclosed and claimed formulations include one or more metal chelating agents. Metal chelating agents can function to increase the capacity of the composition to retain metals in solution and to enhance metal etch rates. Typical examples of chelating agents useful for this purpose are the following organic acids and their isomers and salts: ethylenediaminetetraacetic acid (EDTA), butylenediaminetetraacetic acid, (1,2-cyclohexylenediamine)tetraacetic acid (CyDTA), diethylenetriaminepentaacetic acid (DETPA), ethylenediaminetetrapropionic acid, (hydroxyethyl)ethylenediaminetriacetic acid (HEDTA), N,N, N', N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), iminodiacetic acid, methyliminodiacetic acid, propylenediaminetetraacetic acid, nitrotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, propyl gallate, pyrogallol, 8-hydroxyquinoline, and cysteine. Preferred chelating agents are aminocarboxylic acids such as EDTA, CyDTA and iminodiacetic acid.

In some embodiments, the at least one chelating agent includes EDTA. In some embodiments, the at least one chelating agent consists essentially of EDTA. In some embodiments, the at least one chelating agent consists of EDTA.

In some embodiments, the at least one chelating agent includes CyDTA. In some embodiments, the at least one chelating agent consists essentially of CyDTA. In some embodiments, the at least one chelating agent consists of CyDTA.

In some embodiments, the at least one chelating agent includes iminodiacetic acid. In some embodiments, the at least one chelating agent consists essentially of iminodiacetic acid. In some embodiments, the at least one chelating agent consists of iminodiacetic acid.

For most applications, the formulations will include from about 0.1 wt. % to about 10 wt. % of the chelating agent. In some embodiments, the formulations will include from about 0.1 wt. % to about 5 wt. % of the chelating agent. In some embodiments, the formulations will include from about 0.1 wt. % to about 3 wt. % of the chelating agent. In some embodiments, the formulations will include from about 0.1 wt. % to about 2 wt. % of the chelating agent. In some embodiments, the formulations will include from about 0.1 wt. % to about 1 wt. % of the chelating agent. Preferably, the formulations will include from about 0.1 wt. % to about 0.5 wt. % of the chelating agent. In other embodiments, the formulations will include about 0.1 wt. % of the chelating agent.

In other embodiments, the formulations include about 0.1 wt. % of EDTA. In other embodiments, the formulations consist essentially of about 0.1 wt. % of EDTA. In other embodiments, the formulations consist of about 0.1 wt. % of EDTA.

In other embodiments, the formulations include about 0.1 wt. % of iminodiacetic acid. In other embodiments, the formulations consist essentially of about 0.1 wt. % of iminodiacetic acid. In other embodiments, the formulations consist of about 0.1 wt. % of iminodiacetic acid.

Water Miscible Solvent

As described above, the disclosed and claimed formulations include one or more water miscible solvents capable of changing surface wettability in order to improve the roughness performance on copper surfacing. Suitable water miscible solvents include, but are not limited to, ethylene glycol, propylene glycol (PG), 1,4-butanediol, tripropylene glycol methyl ether, propylene glycol propyl ether, diethylene gycol n-butyl ether (BDG), dipropylene glycol methyl ether (DPM) hexyloxypropylamine, poly(oxyethylene)diamine, dimethyl sulfoxide (DMSO), tetrahydrofuran, tetrahydrofurfuryl alcohol, glycerol, alcohol(s), sulfolane, sulfoxides, or mixtures thereof. Preferred water miscible solvents are propylene glycol (PG), sulfolane and diethylene glycol butyl ether (BDG).

For most applications, the formulations include from about 1 wt. % to about 25 wt. % of the water miscible solvents. In other embodiments, the one or more water miscible solvent of the formulations consists essentially of from about 1 wt. % to about 25 wt. % of the water miscible solvents. In other embodiments, the one or more water miscible solvent of the formulations consists from about 1 wt. % to about 25 wt. % of the water miscible solvents.

In other embodiments, the one or more water miscible solvent of the formulations includes from about 5 wt. % to about 20 wt. % of the water miscible solvents. In other embodiments, the one or more water miscible solvent of the formulations consists essentially of from about 5 wt. % to about 20 wt. % of the water miscible solvents. In other embodiments, the one or more water miscible solvent of the formulations consists from about 5 wt. % to about 20 wt. % of the water miscible solvents.

In other embodiments, the one or more water miscible solvent of the formulations includes from about 10 wt. % to about 20 wt. % of the water miscible solvents. In other embodiments, the one or more water miscible solvent of the formulations consists essentially of from about 10 wt. % to about 20 wt. % of the water miscible solvents. In other embodiments, the one or more water miscible solvent of the formulations consists from about 10 wt. % to about 20 wt. % of the water miscible solvents.

In other embodiments, the one or more water miscible solvent of the formulations includes from about 15 wt. % to about 20 wt. % of the water miscible solvents. In other embodiments, the one or more water miscible solvent of the formulations consists essentially of from about 15 wt. % to about 20 wt. % of the water miscible solvents. In other embodiments, the one or more water miscible solvent of the formulations consists from about 15 wt. % to about 20 wt. % of the water miscible solvents.

In other embodiments, the one or more water miscible solvent of the formulations includes about 20 wt. % of the water miscible solvents. In other embodiments, the one or more water miscible solvent of the formulations consists essentially of about 20 wt. % of the water miscible solvents. In other embodiments, the one or more water miscible solvent of the formulations consists of about 20 wt. % of the water miscible solvents.

In some embodiments the water miscible solvent includes PG. Thus, such formulations include from about 1 wt. % to about 25 wt. % of PG. In other embodiments, the one or more water miscible solvent of the formulations consists essentially of from about 1 wt. % to about 25 wt. % of PG. In other embodiments, the one or more water miscible solvent of the formulations consists from about 1 wt. % to about 25 wt. % of PG.

In other embodiments, the one or more water miscible solvent of the formulations includes from about 5 wt. % to about 20 wt. % of PG. In other embodiments, the one or more water miscible solvent of the formulations consists essentially of from about 5 wt. % to about 20 wt. % of PG. In other embodiments, the one or more water miscible solvent of the formulations consists from about 5 wt. % to about 20 wt. % of PG.

In other embodiments, the one or more water miscible solvent of the formulations includes from about 10 wt. % to about 20 wt. % of PG. In other embodiments, the one or more water miscible solvent of the formulations consists essentially of from about 10 wt. % to about 20 wt. % of PG. In other embodiments, the one or more water miscible solvent of the formulations consists from about 10 wt. % to about 20 wt. % of PG.

In other embodiments, the one or more water miscible solvent of the formulations includes from about 15 wt. % to about 20 wt. % of PG. In other embodiments, the one or more water miscible solvent of the formulations consists essentially of from about 15 wt. % to about 20 wt. % of PG. In other embodiments, the one or more water miscible solvent of the formulations consists from about 15 wt. % to about 20 wt. % of PG.

In other embodiments, the one or more water miscible solvent of the formulations includes about 20 wt. % of PG. In other embodiments, the one or more water miscible solvent of the formulations consists essentially of about 20 wt. % of PG. In other embodiments, the one or more water miscible solvent of the formulations consists of about 20 wt. % of PG.

In some embodiments the water miscible solvent includes PG. Thus, such formulations include from about 1 wt. % to about 25 wt. % of sulfolane. In other embodiments, the one or more water miscible solvent of the formulations consists essentially of from about 1 wt. % to about 25 wt. % of sulfolane. In other embodiments, the one or more water miscible solvent of the formulations consists from about 1 wt. % to about 25 wt. % of sulfolane.

In other embodiments, the one or more water miscible solvent of the formulations includes from about 5 wt. % to about 20 wt. % of sulfolane. In other embodiments, the one or more water miscible solvent of the formulations consists essentially of from about 5 wt. % to about 20 wt. % of sulfolane. In other embodiments, the one or more water miscible solvent of the formulations consists from about 5 wt. % to about 20 wt. % of sulfolane.

In other embodiments, the one or more water miscible solvent of the formulations includes from about 10 wt. % to about 20 wt. % of sulfolane. In other embodiments, the one or more water miscible solvent of the formulations consists essentially of from about 10 wt. % to about 20 wt. % of sulfolane. In other embodiments, the one or more water miscible solvent of the formulations consists from about 10 wt. % to about 20 wt. % of sulfolane.

In other embodiments, the one or more water miscible solvent of the formulations includes from about 15 wt. % to about 20 wt. % of sulfolane. In other embodiments, the one or more water miscible solvent of the formulations consists essentially of from about 15 wt. % to about 20 wt. % of sulfolane. In other embodiments, the one or more water miscible solvent of the formulations consists from about 15 wt. % to about 20 wt. % of sulfolane.

In other embodiments, the one or more water miscible solvent of the formulations includes about 20 wt. % of sulfolane. In other embodiments, the one or more water miscible solvent of the formulations consists essentially of about 20 wt. % of sulfolane. In other embodiments, the one or more water miscible solvent of the formulations consists of about 20 wt. % of sulfolane.

In some embodiments the water miscible solvent includes BDG. Thus, such formulations include from about 1 wt. % to about 25 wt. % of BDG. In other embodiments, the one or more water miscible solvent of the formulations consists essentially of from about 1 wt. % to about 25 wt. % of BDG. In other embodiments, the one or more water miscible solvent of the formulations consists from about 1 wt. % to about 25 wt. % of BDG.

In other embodiments, the one or more water miscible solvent of the formulations includes from about 5 wt. % to about 20 wt. % of BDG. In other embodiments, the one or more water miscible solvent of the formulations consists essentially of from about 5 wt. % to about 20 wt. % of BDG. In other embodiments, the one or more water miscible solvent of the formulations consists from about 5 wt. % to about 20 wt. % of BDG.

In other embodiments, the one or more water miscible solvent of the formulations includes from about 10 wt. % to about 20 wt. % of BDG. In other embodiments, the one or more water miscible solvent of the formulations consists essentially of from about 10 wt. % to about 20 wt. % of BDG. In other embodiments, the one or more water miscible solvent of the formulations consists from about 10 wt. % to about 20 wt. % of BDG.

In other embodiments, the one or more water miscible solvent of the formulations includes from about 15 wt. % to about 20 wt. % of BDG. In other embodiments, the one or more water miscible solvent of the formulations consists essentially of from about 15 wt. % to about 20 wt. % of BDG. In other embodiments, the one or more water miscible solvent of the formulations consists from about 15 wt. % to about 20 wt. % of BDG.

In other embodiments, the one or more water miscible solvent of the formulations includes about 20 wt. % of BDG. In other embodiments, the one or more water miscible solvent of the formulations consists essentially of about 20 wt. % of BDG. In other embodiments, the one or more water miscible solvent of the formulations consists of about 20 wt. % of BDG.

Wettability Adjusting Material (e.g., Surfactants)

As described above, the disclosed and claimed formulations can include at least one water-soluble wettability adjusting material such as a nonionic surfactant. Surfactants serve to aid in the removal of residue.

In one embodiment, the wettability adjusting material includes a surfactant. In another embodiment, the wettability adjusting material consist essentially of a surfactant. In another embodiment, the wettability adjusting material consist of a surfactant.

Examples of the water-soluble wettability adjusting material dispersing agents include polyoxyethylene lauryl ether, polyoxyethylene cetyl ether, polyoxyethylene steary ether, polyoxyethylene oleyl ether, polyoxyethylene higher alcohol ether, polyoxyethylene octyl phenyl ether, polyoxyethylene nonyl phenyl ether, polyoxyethylene derivatives, polyoxyethylene sorbitan monolaurate, polyoxyethylene sorbitan monopalmitate, polyoxyethylene sorbitan monostearate, polyoxyethylene sorbitan tristearate, polyoxyethylene sorbitan monooleate, polyoxyethylene sorbitan trioleate, polyoxyethylene sorbit tetraoleate, polyethylene glycol monolaurate, polyethylene glycol monostearate, polyethylene glycol distearate, polyethylene glycol monooleate, polyoxyethylene alkylamine, polyoxyethylene hardened castor oil, alkylalkanolamide, and mixtures thereof.

Commercially available surfactants that can be used in the disclosed and claimed formulations include, but are not limited to, Triton™ X-100 (4-(1,1,3,3-Tetramethylbutyl)phenyl-polyethylene glycol solution) and Dynol™ 607 (a commercial product form Air products).

If present, the formulations will include from about 0.001 wt. % to about 5 wt. % of the surfactant. In other embodiments, the formulations will include from about 0.01 wt. % to about 2.5 wt. % of the surfactant. In other embodiments, the formulations will include from about 0.1 wt. % to about 1.0 wt. % of the surfactant.

Examples

Reference will now be made to more specific embodiments of the present disclosure and experimental results that provide support for such embodiments. The examples are given below to more fully illustrate the disclosed subject matter and should not be construed as limiting the disclosed subject matter in any way.

It will be apparent to those skilled in the art that various modifications and variations can be made in the disclosed subject matter and specific examples provided herein without departing from the spirit or scope of the disclosed subject matter. Thus, it is intended that the disclosed subject matter, including the descriptions provided by the following examples, covers the modifications and variations of the disclosed subject matter that come within the scope of any claims and their equivalents.

Materials and Methods:
Ingredients and Abbreviations
The abbreviations used in the Examiners are as follows:

| Abbreviation | Full Name |
| --- | --- |
| MEA | Monoethanolamine |
| NMEA | N-methylethanolamine |
| PG | Propylene Glycol |
| BDG | Diethylene Glycol Butyl Ether |

Etch Rate Measurement:

The simulation of Galvanic corrosion effect by coupling test is to fix two metals wafer coupon contacting with each other face to face as shown in FIG. 1. The etching rate was measured by 4-point ResMap probe and the roughness data was measured by a Bruker ICON AFM tool. Etching rates in Tables 1-5 were measured at 30° C. with a 1 to 5-minute time frame.

Comparative Examples

Amine solutions, without other ingredients, were prepared in 0.8 M water to evaluate the Cu and CO etching rates as follows:

TABLE 1

Role of Different Amine in 0.8M Water Solution

| Amine Solution | Triethanolamine | N-methylethanolamine | Monoethanolamine |
| --- | --- | --- | --- |
| pH | 11 | 11.9 | 11.9 |
| Cu E/R(A/min) | 21 | 70 | 244 |
| Co E/R(A/min) | 22 | 11 | 15 |
| Coupled Cu E/R(A/min) | 41.2 | 70.2 | 125 |
| Coupled Co E/R(A/min) | 36.9 | 42.1 | 60.1 |
| Cu/Co E/R Ratio | 1.12 | 1.67 | 2.08 |

Figure 2:
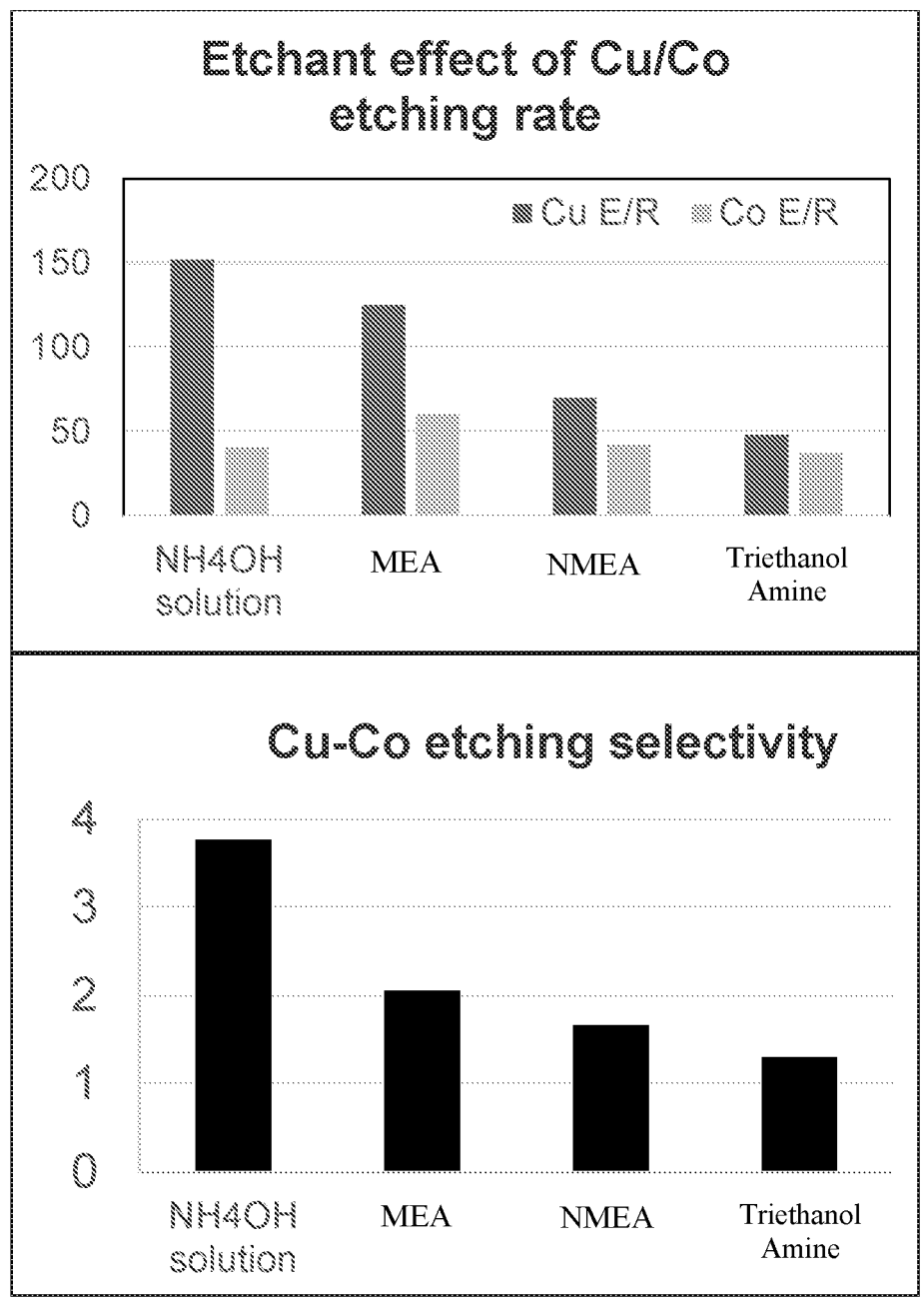
FIG. 2 graphically illustrates coupled Co/Cu etching rates for several alkanolamines.

As can be seen, the primary amine shows the highest etching rate of copper while cobalt etching rate were low in all amines. The coupled etching rates are graphically illustrated in FIG. 2.

Working Examples

A. Analysis of pH Effect

TABLE 2 pH Effect by Adjusting HF

| Component | Ex. 1 | Ex. 2 | Ex. 3 | Ex. 4 | Ex. 5 | Ex. 6 |
|---|---|---|---|---|---|---|
| DIW | 95 | 94.875 | 94.75 | 94.5 | 94.25 | 94.0 |
| MEA | 5 | 5 | 5 | 5 | 5 | 5 |
| HF | — | 0.125 | 0.25 | 0.5 | 0.75 | 1.0 |
| Total | 100 | 100 | 100 | 100 | 100 | 100 |
| pH | 11.49 | 10.91 | 10.49 | 10.24 | 9.86 | 9.2 |
| Cu E/R(A/min) | 231.4 | 182.4 | 133.7 | 129.1 | 102.4 | 94.2 |
| Co E/R(A/min) | 15.2 | 18.9 | 23.8 | 32.4 | 36.5 | 43.4 |
| Coupled Cu E/R | 125 | 102 | 91.7 | — | — | — |
| Coupled Co E/R | 60.1 | 70.2 | 41.4 | — | — | — |
| Cu/Co E/R Ratio | 2.08 | 1.45 | 2.21 | — | — | — |

Figure 3:
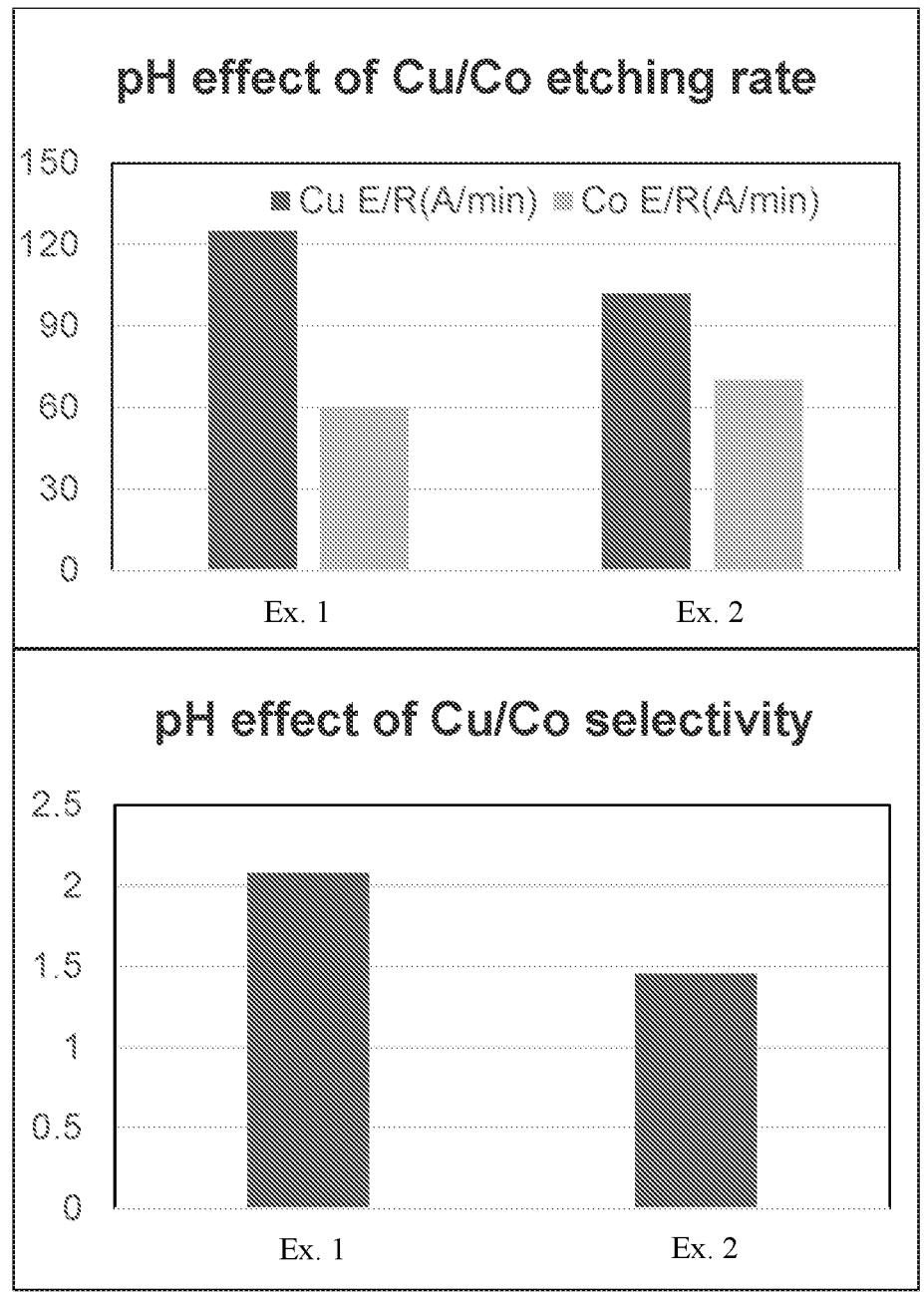
FIG. 3 graphically illustrates the effect on coupled etching rate due to adding a pH adjuster (Ex. 2) compared to a solution without a pH adjuster (Ex. 1)

As shown in Table 2, the copper etching was increased when pH value increased but there was a simultaneous decrease in the cobalt etching rate. The etching rates for Cu and Co were collected with the metals individually and when coupled. The coupled etching rates for Ex. 1 and Ex. 2 are graphically illustrated in FIG. 3. When the etching rates were collected from samples in which the two metals were coupled to each other, the etching rate of higher activity metal would be increased while the etching rate of lower activity metals would be decreased. This analysis better simulates the Galvanic corrosion effect in a real device wafer.

B. Analysis of Chelating Agent Effect

TABLE 3

Chelating Agent Effect for Improving Cu to Co Selectivity

| Component | Ex. 3 | Ex. 7 | Ex. 8 |
|---|---|---|---|
| DIW | 94.75 | 94.65 | 94.65 |
| MEA | 5 | 5 | 5 |
| HF | 0.25 | 0.25 | 0.25 |
| EDTA | — | 0.1 | — |
| Iminodiacetic Acid | — | — | 0.1 |
| Total | 100 | 100 | 100 |
| pH | 10.48 | 10.49 | 10.4 |
| Coupled Cu E/R | 91.7 | 83.1 | 101.5 |
| Coupled Co E/R | 41.4 | 79.5 | 93.5 |
| Cu to Co Ratio | 2.21 | 1.05 | 1.09 |

Figure 4:
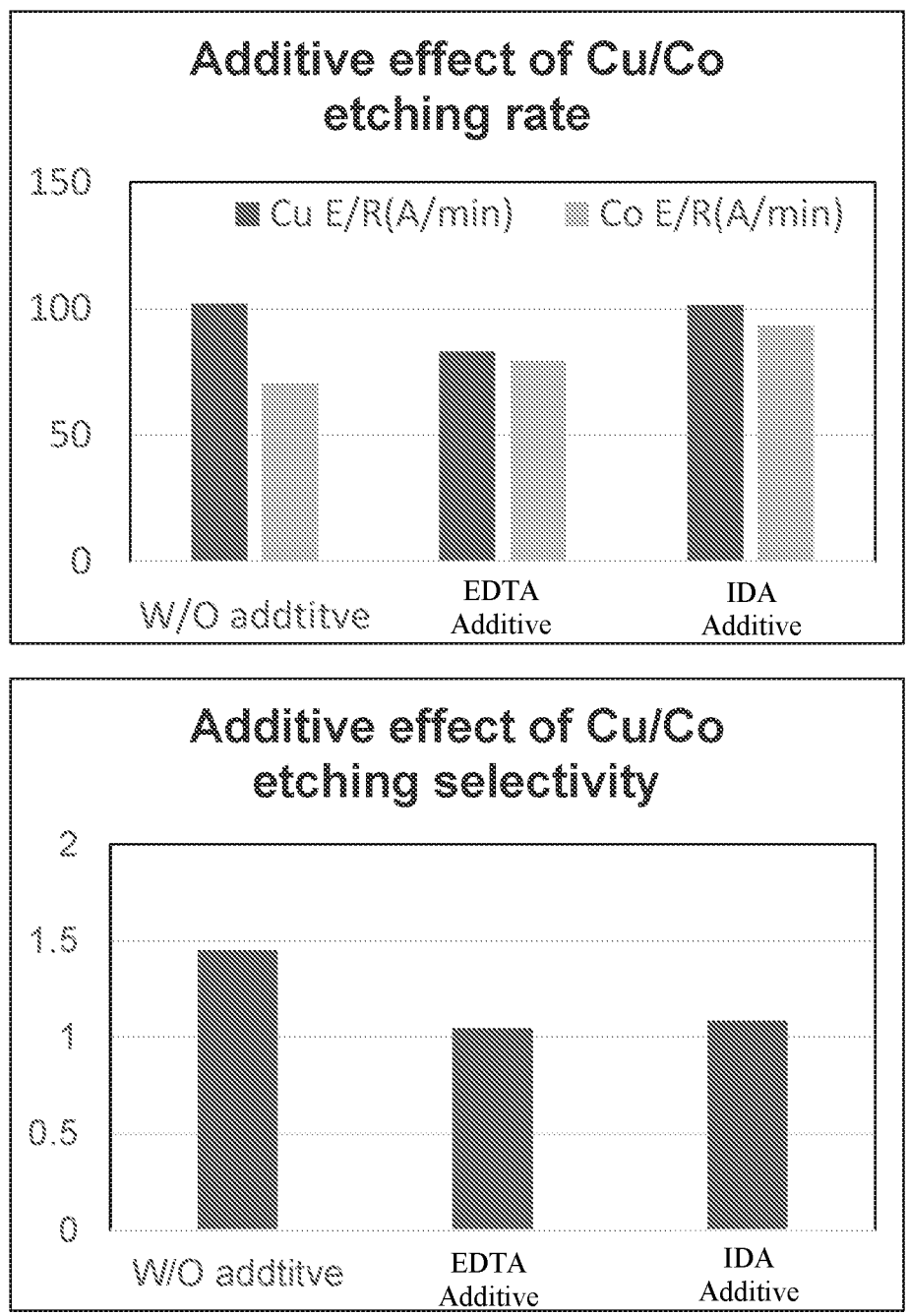
FIG. 4 graphically illustrates the effect on etching rate due to adding a chelating agent on Cu and Co selectivity.

As shown in Table 3, the addition of a chelating agent (e.g., to the formulation of Ex. 3) significantly increases the selectivity of the Cu to Co etching rate from 2.21 to 1.05-1.09 while also maintaining the respective etching rates of both metals. FIG. 4 graphically illustrates this data.

C. Analysis of Solvent Effect on Roughness

TABLE 4

Solvent Effect on Roughness Performance

| Component | Ex. 9 | Ex. 10 | Ex. 11 | Ex. 12 |
|---|---|---|---|---|
| DIW | 93.7 | 73.7 | 73.7 | 73.7 |
| PG | — | 20 | — | — |
| Sulfolane | — | — | 20 | — |
| BDG | — | — | — | 20 |
| MEA | 5 | 5 | 5 | 5 |
| EDTA | 0.1 | 0.1 | 0.1 | 0.1 |
| Methanesulfonic Acid | 1.2 | 1.2 | 1.2 | 1.2 |
| Total | 100 | 100 | 100 | 100 |
| Coupled Cu E/R | 83.1 | 42.17 | 92.7 | 116.37 |
| Coupled Co E/R | 79.5 | 39.1 | 74.7 | 82.9 |
| Cu to Co Ratio | 1.05 | 1.08 | 1.24 | 1.40 |
| Roughness-Ra Value (nm) | 5.84 | 4 | 3.71 | 3.66 |
| Roughness-Rq Value (nm) | 7.06 | 5.04 | 4.46 | 4.4 |
| Z-range | 43.9 | 48.1 | 29.6 | 27.9 |

Figure 5:
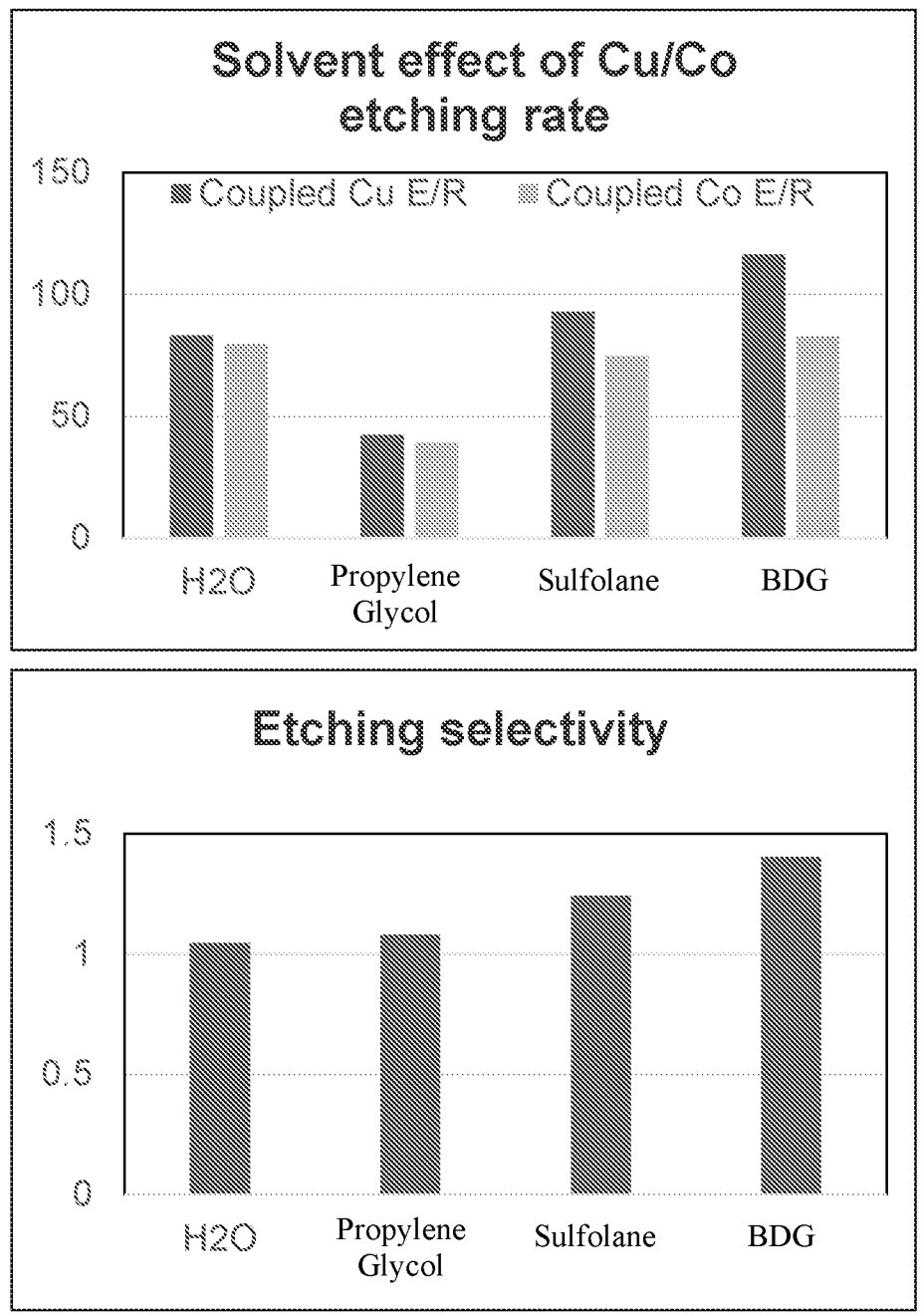
FIG. 5 graphically illustrates the effect on etching rate due to the addition of a solvent capable of changing surface wettability.

As shown in Table 4, the addition of a solvent capable of changing surface wettability produced significantly better roughness performance on copper surfacing. FIG. 5 graphically illustrates this data.

D. Analysis of Solvent Plus Surfactant Effect on Roughness

TABLE 5

Roughness Data of Formulations with Solvent and Surfactant

| Component | Ex. 13 | Ex. 14 | Ex. 15 | Ex. 16 | Ex. 17 |
|---|---|---|---|---|---|
| DIW | 93.7 | 93.6 | 93.7 | 56.68 | 56.68 |
| PG | — | — | — | 20 | 20 |
| BDG | — | — | — | 20 | 20 |
| MEA | 5 | 5 | 5 | 2 | 2 |
| EDTA | 0.1 | 0.1 | 0.1 | 0.1 | — |
| Iminodiacetic Acid | — | — | — | — | 0.1 |
| Methanesulfonic Acid | 1.2 | 1.2 | 1.2 | 1.2 | 1.2 |
| Triton ™ X-100 | — | 0.1 | — | — | — |
| Dynol ™ 607 | — | — | 0.02 | 0.02 | 0.02 |
| Total | 100 | 100 | 100 | 100 | 100 |
| Coupled Cu E/R | 83.1 | 101.5 | 92.5 | 49.7 | 60.4 |
| Coupled Co E/R | 79.5 | 102.3 | 87.6 | 40.7 | 61.37 |
| Cu to Co Ratio | 1.05 | 0.99 | 1.06 | 1.22 | 0.98 |
| Roughness-Ra Value (nm) | 5.84 | 3.08 | 2.97 | 3.44 | 1.64 |
| Roughness-Rq Value (nm) | 7.06 | 3.7 | 3.69 | 4.2 | 2.07 |
| Z-range | 43.9 | 24.4 | 25.8 | 32.8 | 18.5 |

Figure 6:
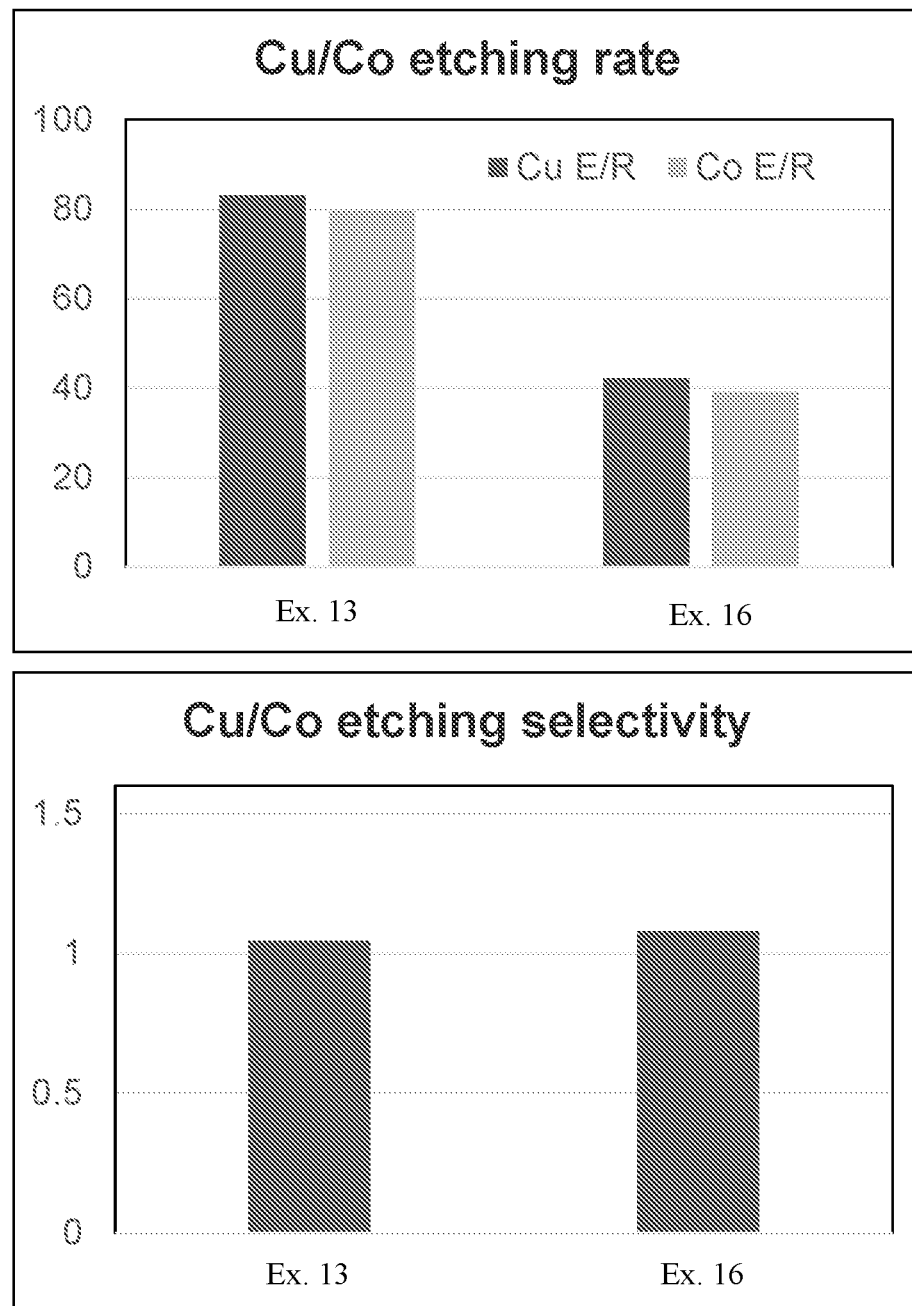
FIG. 6 graphically illustrates the effect on etching rate due to the addition of a surfactant in Ex. 13 and Ex. 16.

As shown in Table 5, the roughness can be further improved by adding a surfactant into the alkaline solutions. Table 5 demonstrates that adding both a wettability improving solvent and surfactant improves the roughness from 5.84 to 1.64 (ca. 7200 improvement). FIG. 6 illustrates the data for Ex. 13 and Ex. 16. FIG. 7 illustrates the surface roughness analysis for these samples.

Results

As shown in the above tables, the disclosed and claimed formulations provide copper etching rates of greater that approximately 50 k/minute and a cobalt etching rates of greater that approximately 50 k/minute when copper and cobalt are coupled and do so while also providing desirable Cu to Co etching rate ratios when copper and cobalt are coupled. As demonstrated, the coupled Co—Cu etching rate ratio are generally between approximately 0.9 to approximately 2.25. In some embodiments, the copper to cobalt etching rate ratio is approximately 1.0 to approximately 2.20 when copper and cobalt are coupled. In other embodiments, the copper to cobalt etching rate ratio is approximately 0.95 to approximately 1.25 when copper and cobalt are coupled. In other embodiments, the copper to cobalt etching rate ratio is approximately 0.95 to approximately 1.1 when copper and cobalt are coupled. In other embodiments, the copper to cobalt etching rate ratio is approximately 1.0 to approximately 1.1 when copper and cobalt are coupled. In other embodiments, the copper to cobalt etching rate ratio is approximately 1.0 when copper and cobalt are coupled.

Given the above copper to cobalt etching rates, in some embodiments the formulation has a copper etching rate of greater that approximately 50 Å/minute and a cobalt etching rate of greater than approximately 50 Å/minute when copper and cobalt are coupled and also a copper to cobalt etching rate ratio of approximately 0.95 to approximately 1.25 when copper and cobalt are coupled. In other embodiments, the formulation has a copper etching rate of greater that approximately 50 Å/minute and a cobalt etching rate of greater that approximately 50 Å/minute when copper and cobalt are coupled and also a copper to cobalt etching rate ratio of approximately 0.95 to approximately 1.1 when copper and cobalt are coupled. In yet other embodiments, the formulation has a copper etching rate of greater that approximately 50 Å/minute and a cobalt etching rate of greater that approximately 50 Å/minute when copper and cobalt are coupled and also a copper to cobalt etching rate ratio of approximately 1 when copper and cobalt are coupled.

Although the invention has been described and illustrated with a certain degree of particularity, it is understood that the disclosure has been made only by way of example, and that numerous changes in the conditions and order of steps can be resorted to by those skilled in the art without departing from the spirit and scope of the invention.

What is claimed is:

1. A formulation consisting of:
   (i) at least one alkanolamine having at least two carbon atoms, at least one amino substituent and at least one hydroxyl substituent with the amino and hydroxyl substituents attached to two different carbon atoms;
   (ii) at least one pH adjuster comprising an inorganic acid or an organic acid selected from the group consisting of citric acid, sulfuric acid, phosphoric acid, oxalic acid, malonic acid, lactic acid, adipic acid, acetic acid, trifluoroacetic acid, methanesulfonic acid, toluenesulfonic acid and a halogen acids of the formula H—X wherein X=F, Cl, Br, or I;
   (iii) at least one chelating agent;
   (iv) water;
   (v) optionally at least one water miscible solvent; and
   (vi) optionally at least one organic wettability adjusting material,
   wherein the formulation has a pH between approximately 9 and approximately 12.

2. The formulation of claim 1, wherein the (v) at least one water miscible solvent is present.

3. The formulation of claim 2, wherein the at least one water miscible solvent comprises one or more of ethylene glycol, propylene glycol (PG), 1,4-butanediol, tripropylene glycol methyl ether, propylene glycol propyl ether, diethylene gycol n-butyl ether (BDG), dipropylene glycol methyl ether (DPM), hexyloxypropylamine, poly(oxyethylene)diamine, dimethyl sulfoxide (DMSO), tetrahydrofuran, tetrahydrofurfuryl alcohol, glycerol, alcohols, sulfolane, sulfoxides, and mixtures thereof.

4. The formulation of claim 2, wherein the at least one water miscible solvent comprises from about 10 wt. % to about 20 wt. % of propylene glycol.

5. The formulation of claim 1, wherein the (v) at least one water miscible solvent is present and the (vi) at least one wettability adjusting material is present.

6. The formulation of claim 1, wherein the at least one alkanolamine comprises a compound of formula (I):

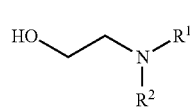

wherein each of $R^1$ and $R^2$ is independently selected from H, an unsubstituted $C_1$-$C_6$ alkyl, a substituted $C_1$-$C_6$ alkyl, a branched $C_3$-$C_6$ alkyl and a $C_1$-$C_6$ alkylamino.

7. The formulation of claim 1, wherein the at least one alkanolamine comprises

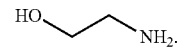

8. The formulation of claim 1, wherein the at least one alkanolamine comprises

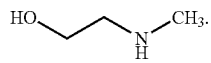

9. The formulation of claim 1, wherein the at least one alkanolamine comprises

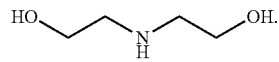

10. The formulation of claim 1, wherein the at least one alkanolamine comprises

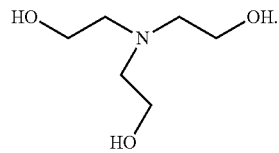

11. The formulation of claim 1, wherein the at least one pH adjuster comprises hydrofluoric acid.

12. The formulation of claim 1, wherein the at least one pH adjuster comprises methanesulfonic acid.

13. The formulation of claim 1, wherein the at least one chelating agent is one or more of ethylenediaminetetraacetic acid (EDTA), butylenediaminetetraacetic acid, (1,2-cyclohexylenediamine)tetraacetic acid (CyDTA), diethylenetriaminepentaacetic acid (DETPA), ethylenediaminetetrapropionic acid, (hydroxyethyl)ethylenediaminetriacetic acid (HEDTA), N, N, N', N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), iminodiacetic acid, methyliminodiacetic acid, propylenediaminetetraacetic acid, nitrotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, propyl gallate, pyrogallol, 8-hydroxyquinoline, and cysteine.

14. The formulation of claim 1, wherein the at least one chelating agent comprises EDTA.

15. The formulation of claim 1, wherein the at least one chelating agent comprises CyDTA.

16. The formulation of claim 1, wherein the at least one chelating agent comprises iminodiacetic acid.

17. The formulation of claim 1, wherein the at least one water miscible solvent comprises from about 10 wt. % to about 20 wt. % of diethylene glycol butyl ether.

18. The formulation of claim 1, wherein the formulation has a copper etching rate of greater than approximately 50 Å/minute and a cobalt etching rate of greater than approximately 50 Å/minute when copper and cobalt are coupled.

19. The formulation of claim 1, wherein the formulation has a copper to cobalt etching rate ratio of approximately 0.9 to approximately 2.25 when copper and cobalt are coupled.

20. The formulation of claim 1, wherein the formulation has a copper to cobalt etching rate ratio of approximately 1.0 when copper and cobalt are coupled.

21. A method of etching a substrate comprising copper and cobalt, the method comprising:
   (i) applying a composition comprising the formulation of claim 1 onto the substrate.

\* \* \* \* \*